United States Patent
Chung et al.

(10) Patent No.: US 10,170,898 B1
(45) Date of Patent: Jan. 1, 2019

(54) SIGNAL LEAKAGE PROOF HOUSING FOR SIGNAL DISTRIBUTORS

(71) Applicant: SIGNAL CABLE SYSTEM CO., LTD., Yilan County (TW)

(72) Inventors: Jui-Huang Chung, Yilan County (TW); Yu-Hung Lin, Yilan County (TW)

(73) Assignee: Signal Cable System Co., Ltd., Yilan County (TW)

( * ) Notice: Subject to any disclaimer, the term of this patent is extended or adjusted under 35 U.S.C. 154(b) by 0 days.

(21) Appl. No.: 16/042,080

(22) Filed: Jul. 23, 2018

(30) Foreign Application Priority Data

Oct. 6, 2017 (TW) .............................. 106214897 U

(51) Int. Cl.
| | |
|---|---|
| *H05K 9/00* | (2006.01) |
| *H02G 3/08* | (2006.01) |
| *H05K 5/04* | (2006.01) |
| *H05K 5/02* | (2006.01) |
| *H05K 5/03* | (2006.01) |

(52) U.S. Cl.
CPC ........... *H02G 3/083* (2013.01); *H05K 5/0247* (2013.01); *H05K 5/03* (2013.01); *H05K 5/04* (2013.01); *H05K 9/0009* (2013.01); *H05K 9/0049* (2013.01)

(58) Field of Classification Search
CPC .................................................. H05K 9/0009
See application file for complete search history.

(56) References Cited

U.S. PATENT DOCUMENTS

| | | | | |
|---|---|---|---|---|
| 4,567,318 A | * | 1/1986 | Shu ...................... | H05K 9/006 174/372 |
| 5,001,298 A | * | 3/1991 | Jong .................... | H05K 9/0056 174/372 |
| 5,095,177 A | * | 3/1992 | Johnson ................. | H04B 15/02 174/372 |
| 5,170,009 A | * | 12/1992 | Kadokura ............. | C09D 5/448 174/363 |
| 7,342,184 B2 | * | 3/2008 | Cochrane ............. | H05K 9/0073 174/366 |
| 7,687,725 B2 | * | 3/2010 | Hogan ................. | H05K 9/0009 174/367 |
| 7,910,839 B2 | * | 3/2011 | Lynam ................. | H05K 9/0009 174/369 |

(Continued)

*Primary Examiner* — Hung V Ngo
(74) *Attorney, Agent, or Firm* — Rosenberg, Klein & Lee

(57) ABSTRACT

A signal leakage proof housing for signal distributors includes a metal case and a metal cover plate. The metal case includes a plurality of signal connection terminals and a circumferential side wall having a top surface. The top surface includes a plurality of fixing protrusions arranged at intervals on and around the top surface and at least one rib on and around the top surface. The metal cover plate includes a bottom surface which includes a plurality of fixing holes on and around the bottom surface. When the metal case and the metal cover plate are assembled together, the plurality of fixing protrusions respectively pass through the corresponding plurality of fixing holes and fix with each other and each one of the at least one rib is in direct contact with the bottom surface of the metal cover plate to achieve the objective of preventing electromagnetic signal leakage.

8 Claims, 8 Drawing Sheets

(56) References Cited

U.S. PATENT DOCUMENTS

| | | | | |
|---|---|---|---|---|
| 8,016,372 B2* | 9/2011 | Yeh | ................... | H05K 9/0009 |
| | | | | 312/223.2 |
| 8,614,900 B2* | 12/2013 | Beaumier | ............. | H01L 23/055 |
| | | | | 361/818 |
| 8,921,710 B2* | 12/2014 | Teo | ................... | H05K 9/0009 |
| | | | | 174/363 |
| 2016/0174420 A1* | 6/2016 | Cochrane | ............. | H05K 9/0009 |
| | | | | 361/818 |

* cited by examiner

SIGNAL LEAKAGE PROOF HOUSING FOR SIGNAL DISTRIBUTORS

CROSS REFERENCE TO RELATED APPLICATION(S)

This non-provisional application claims the benefit under 35 U.S.C. § 119(e) to Patent Application No. 106214897 filed in Taiwan on Oct. 6, 2017, which is hereby incorporated in its entirety by reference into the present application.

BACKGROUND OF THE INVENTION

1. Field of the Invention

This invention relates to a signal leakage proof housing for signal distributors, and in particular, to a signal distributor's housing which is capable of preventing electromagnetic wave signals leaking out from the signal distributor.

2. Description of the Prior Arts

Nowadays, in order to have two TV sets to display the same video contents, a signal distributor is usually used to split one input video signal to two TV sets through the two output ports of the signal distributor, and at the same time, the signal distributor may enhance the split output signals transmitted to the two TV sets. However, the video signal in the form of electromagnetic waves is not allowed to leak from the distributor to the surroundings, so as to prevent signal attenuation of the distributed output signals as well as to prevent possible electromagnetic interferences to the surroundings.

With reference to FIG. 8, a conventional signal distributor housing includes a metal case 30 on which a plurality of signal connection terminals 31 are disposed; in addition, the metal case 30 has a circumferential side wall 32, and on a top surface of the circumferential side wall 32, a plurality of first clamping blocks 33 are disposed in such a way that a plurality of spacings are formed between adjacent first clamping blocks 33; and on an outer periphery of the top surface of the circumferential side wall 32, an outer surrounding frame 34 protrudes upwardly. The conventional signal distributor housing further includes a metal cover plate 40, and a plurality of second clamping blocks 43 are disposed on a periphery of the metal cover plate 40 and the plurality of second clamping blocks 43 are arranged to correspond to the aforesaid plurality of spacings formed between adjacent first clamping blocks 33. And the plurality of second clamping blocks 43 are respectively fixed firmly in the spacings formed by the adjacent first clamping blocks 33 and stopped by an inner wall of the outer surrounding frame 34 when the metal cover plate 40 and the metal case 30 are assembled together. An adhesive glue layer is then coated on the contacting surfaces of the first and the second clamping blocks and the inner wall surface of the outer surrounding frame 34 so as to fix and to hermetically seal the plurality of first clamp blocks 33 with the plurality of second clamping blocks 43 and the inner wall of the outer surrounding frame 34.

However, since the metal cover plate 40 and the metal case 30 of the housing are glued to each other, not only the manufacturing cost is increased but also the disassembly cannot be easily performed during maintenance and can cause parts to be scrapped. Moreover, even after the first and the second clamp blocks are sealed, gaps and cracks may still exist on the sealed surfaces and that may cause leakage of electromagnetic signals.

SUMMARY OF THE INVENTION

In view of the shortcomings of the conventional signal distributor housing, the present invention provides a signal leakage proof housing for signal distributors to serve the objective of preventing leakage of electromagnetic signals.

To achieve the above objective, the signal leakage proof housing for signal distributors comprises a metal case and a metal cover plate, and the metal case comprises a plurality of signal connection terminals and a circumferential side wall. The circumferential side wall comprises a top surface surrounding the metal case, and at least one rib and a plurality of fixing protrusions arranged at intervals are disposed on and around the top surface; the metal cover plate comprises a bottom surface with a plurality of fixing holes on and around the bottom surface thereof. When the metal case is assembled with the metal cover plate, the fixing protrusions respectively pass through the plurality of fixing holes and fix with each other, and each one of the at least one rib is in direct contact with the metal cover plate.

Since the assembly mechanism of the metal cover plate and the metal case of the present invention only uses a plurality of fixing protrusions arranged at intervals and a plurality of fixing holes to be respectively fixed with each other, not only a tight assembly of the metal cover plate and the metal case is ensured and the manufacturing costs are reduced, but also the problem of a difficult disassembly process during maintenance is prevented. Since there is at least one rib disposed around the top surface of the circumferential side wall of the metal case to reduce the possibility of the existence of the gaps or cracks communicating the inside of the metal case to the surroundings, the possibility of the leakage of the electromagnetic wave signals inside the metal case can be reduced to serve the objective of the present invention.

Other objectives, advantages and novel features of the invention will become more apparent from the following detailed description when taken in conjunction with the accompanying drawings.

DETAILED DESCRIPTION OF THE PREFERRED EMBODIMENTS

The following, with the drawings and the preferred embodiment of the present invention, further illustrates the technical means that the present invention adopts to achieve the intended purpose.

With reference to FIG. 1-4, a signal leakage proof housing for signal distributors of this invention comprises a metal case 10 and a metal cover plate 20.

Figure 1:
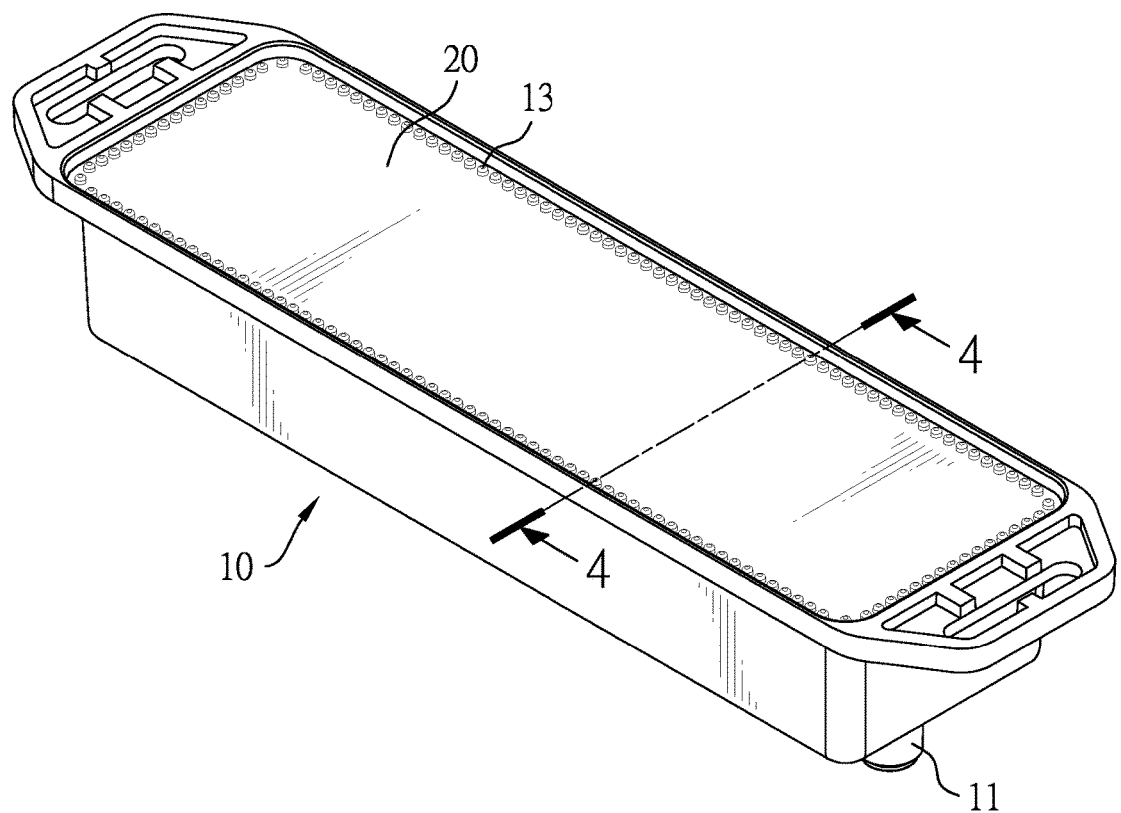
FIG. 1 is a 3D assembly drawing of the first preferred embodiment of this invention.
Figure 2:
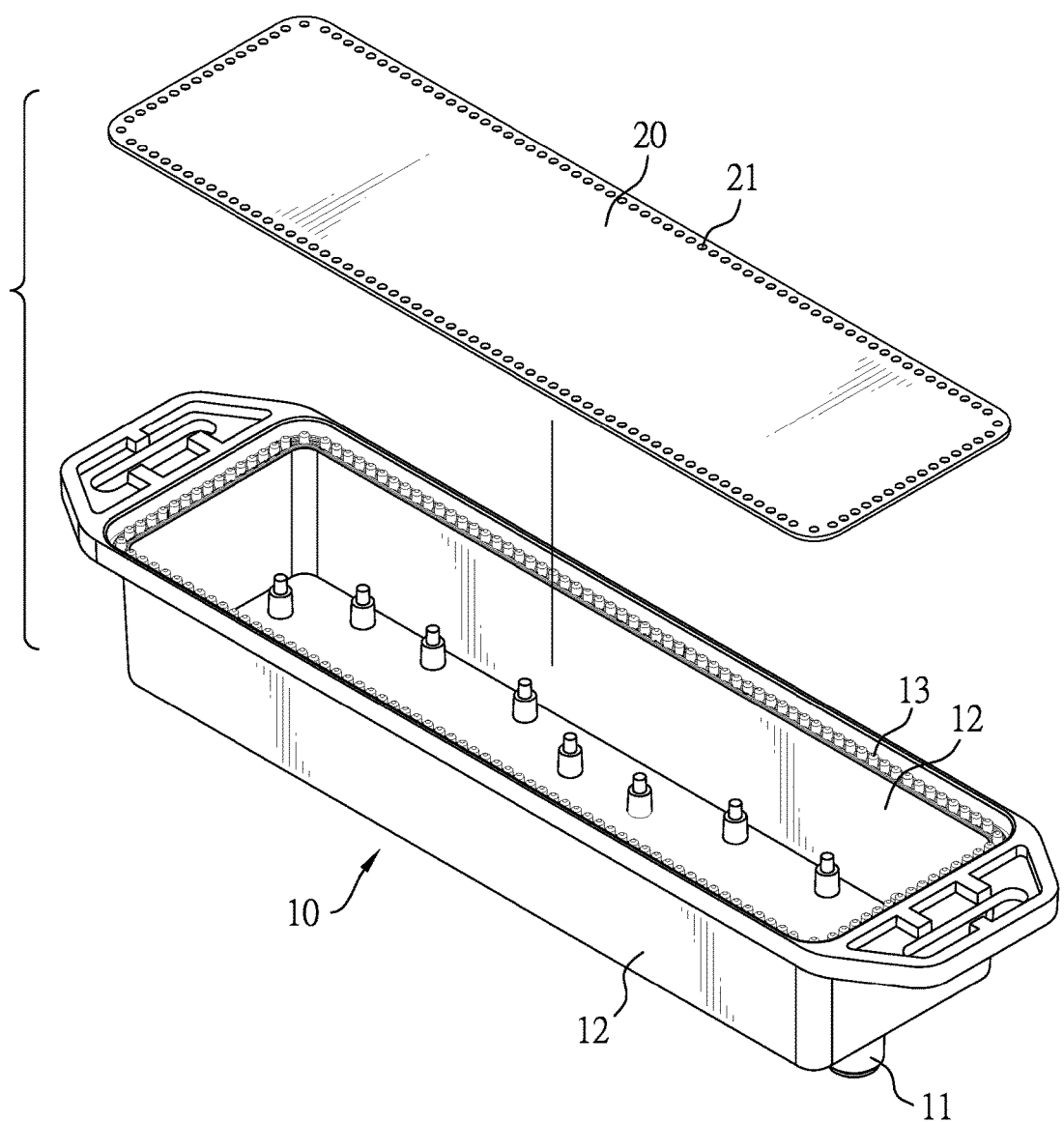
FIG. 2 is an exploded top view of FIG. 1.
Figure 3:
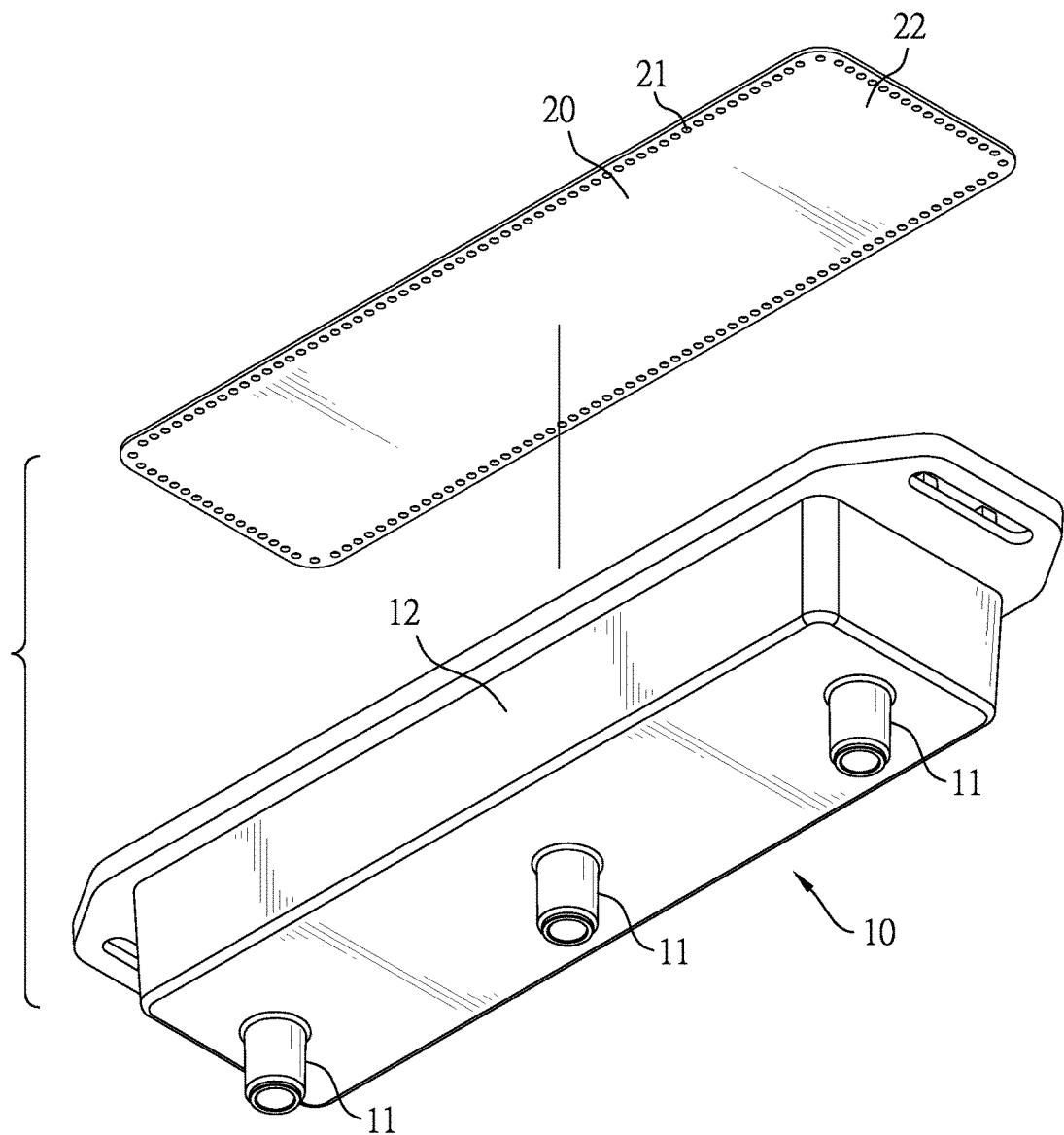
FIG. 3 is an exploded bottom view of FIG. 1.
Figure 4:
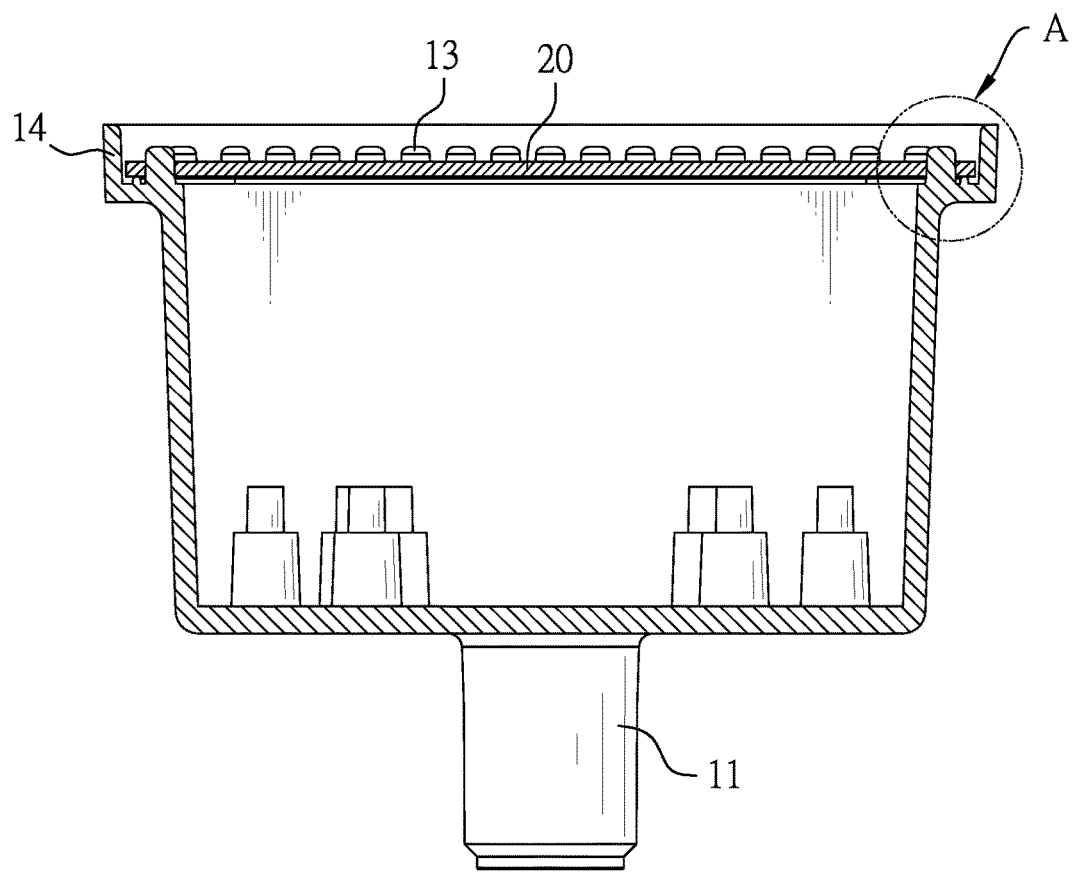
FIG. 4 is a cross-section along the 4-4 plane cutting line in FIG. 1.
Figure 5:
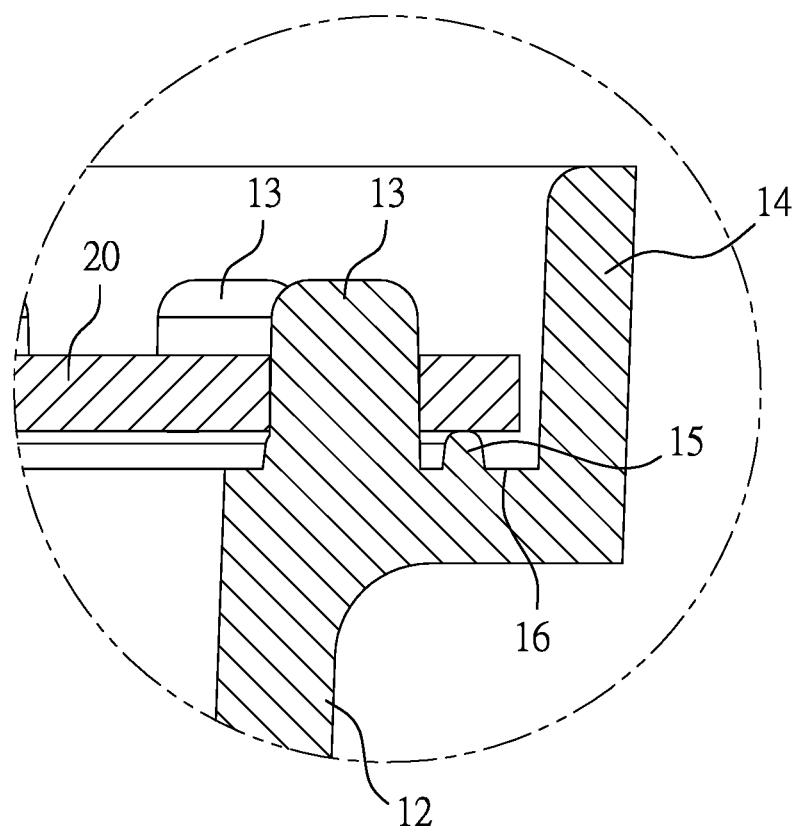
FIG. 5 is an enlarged view of area A in FIG. 4.

The metal case 10 comprises a plurality of signal connection terminals 11 and a circumferential side wall 12. A top surface 16 of the circumferential side wall 12 is provided with a plurality of fixing protrusions 13 which are arranged at intervals and around the top surface 16. The outer periphery of the top surface 16 protrudes upwards to form an outer surrounding frame 14; additionally, as shown in FIG. 5, a rib 15 is further disposed on and around the top surface 16, and the rib 15 is between one side of the plurality of fixing protrusions 13 and the corresponding edge of the top surface 16, and the rib 15 does not overlap with any fixing protrusion 13; another embodiment is shown in FIG. 6 wherein three ribs 15 are further disposed on and around the top surface 16 of the circumferential side wall 12; one of the three ribs 15 is between one side of the plurality of fixing protrusions 13 and the corresponding edge of the top surface 16, and does not overlap with any fixing protrusion 13; whereas, the remaining two ribs 15 are disposed on and around the top surface 16 and are overlapping with the plurality of fixing protrusions 13.

A metal cover plate 20 has a plurality of fixing holes 21 which are corresponding to the plurality of fixing protrusions 13, and the plurality of fixing holes 21 are at and around a periphery of a bottom surface 22 of the metal cover plate 20. The fixing protrusions 13 can pass through the corresponding fixing holes 21 and are tightly fixed to each other when the metal cover plate 20 and the metal case 10 are assembled together. With reference to FIG. 5, after the metal cover plate 20 and the metal case 10 are tightly assembled together, the rib 15 and the bottom surface 22 of the metal cover plate 20 are in direct contact with each other, whereby the possibilities of gaps and cracks between the metal cover plate 20 and the metal case 10 are greatly reduced to effectively prevent leakage of electromagnetic signals, and the objective of the present invention of preventing signal leakage can be thus achieved.

Figure 6:
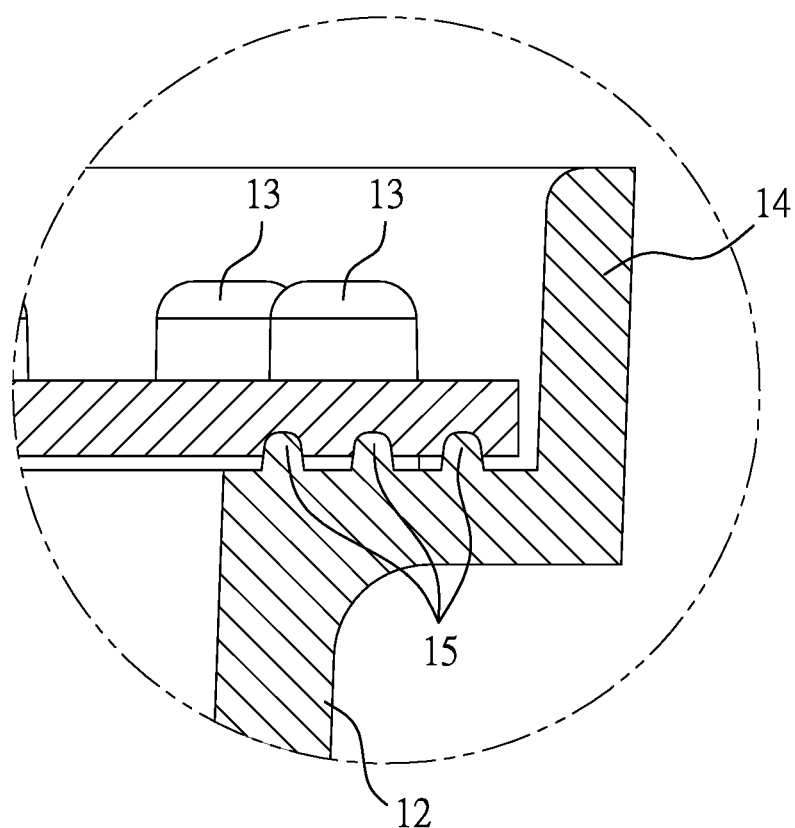
FIG. 6 is another preferred embodiment in FIG. 5 of this invention, wherein the ribs are embedded in the grooves on the metal cover plate.
Figure 7:
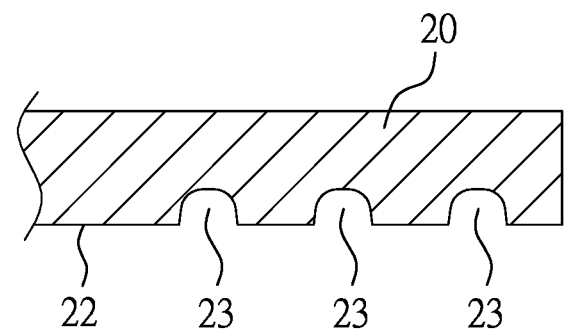
FIG. 7 is the metal cover plate in FIG. 6, wherein the metal cover plate has three ribs.
Figure 8:
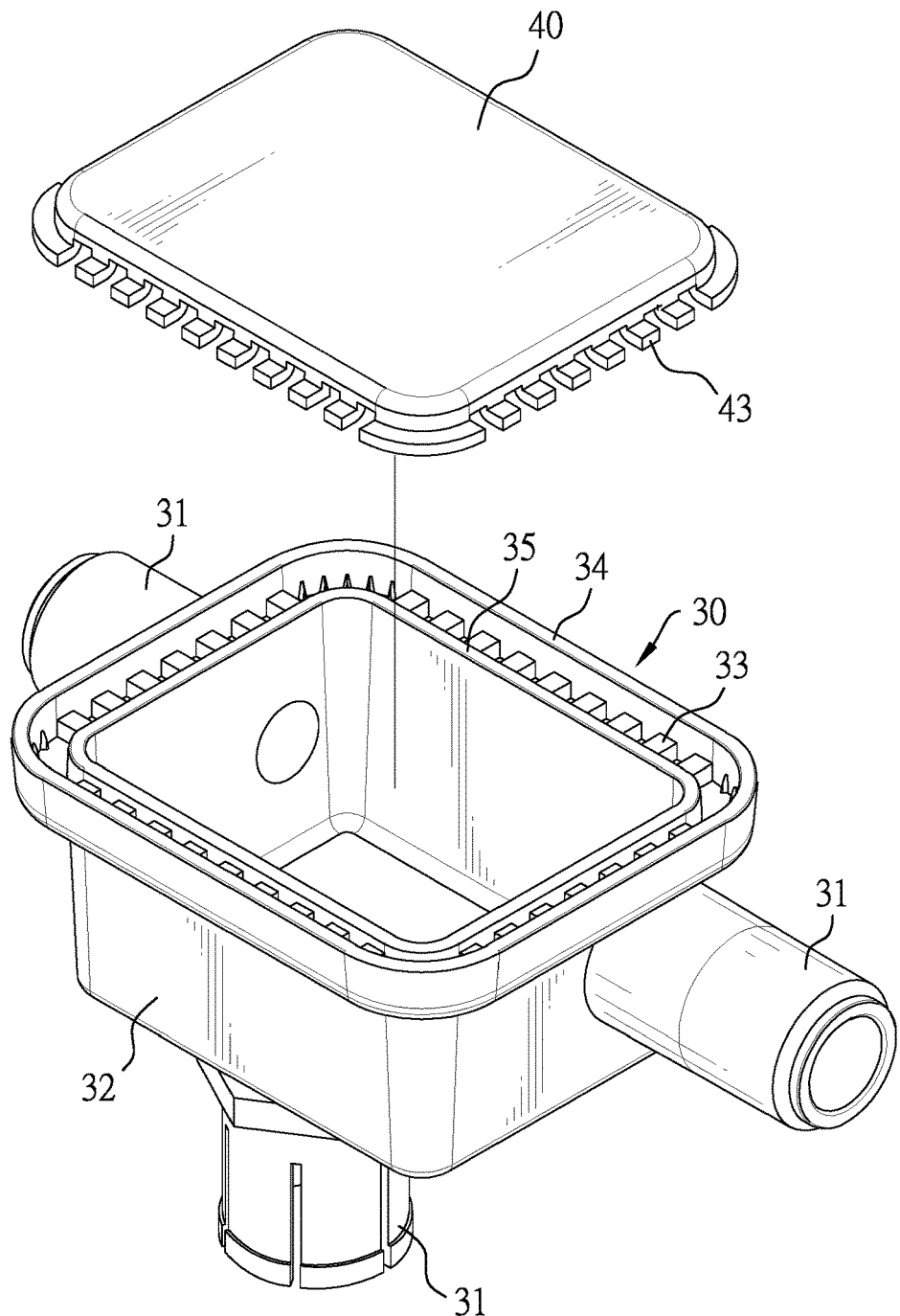
FIG. 8 is the 3D assembly drawing of a conventional signal distributor housing.

With reference to FIG. 6 and FIG. 7 which are related to a three-rib configuration, another preferred embodiment of the present invention is to form three grooves 23 on and around the bottom surface 22 of the metal cover plate 20. The three ribs 15 are at least partially embedded in the corresponding grooves 23 when the metal case 10 and the metal cover plate 20 are assembled together to further reduce the possibilities of having gaps or cracks between the metal case 10 and the metal cover plate 20, so that it can be further ensured that the signal leakage proof housing of this invention can achieve the purpose of preventing leakage of electromagnetic signals. In addition, it is worth mentioning that the formation process of the three grooves 23 on the bottom surface 22 may be any of the conventional industrial formation processes, for example, hot forging, cold forging, stamping, lathe turning, milling, etc. Moreover, when the metal case 10 and the metal cover plate 20 are assembled together, the indentations formed on the bottom surface 22 by pressing the ribs 15 onto the bottom surface 22 of the metal cover plate 20 may also serve as a formation process of the grooves 23.

The locations of the ribs 15 are further elaborated in this paragraph. With reference to FIGS. 5-7, when there is only one rib 15, the rib 15 may be disposed between either side of the plurality of fixing protrusions 13 and the corresponding edge of the top surface 16, and the rib 15 does not overlap with any fixing protrusion 13. Alternatively, the rib 15 may also be disposed overlapping and underneath the plurality of fixing protrusions 13. With reference to FIGS. 6-7, when there are three ribs 15, two of the three ribs 15 may be disposed overlapping and underneath the plurality of fixing protrusions 13, and the remaining rib 15 is disposed between one side of the plurality of fixing protrusions 13 and the corresponding edge of the top surface 16 and does not overlap with any fixing protrusion 13. When there are only two ribs 15, the two ribs 15 may be overlapping and underneath the plurality of fixing protrusions 13. In addition, although not shown in the figures, when there are only two ribs 15, the two ribs 15 may also be disposed between either side of the plurality of fixing protrusions 13 and the corresponding edge of the top surface 16 and do not overlap with any fixing protrusion 13.

In summary, the metal case and the metal cover plate of the present invention are with a high degree of sealing and holding capabilities when they are assembled together so as to effectively prevent the leakage of electromagnetic signals whereby to achieve the purpose of this invention of preventing the leakage of electromagnetic signals.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A signal leakage proof housing for signal distributors, comprising:
   a metal case, comprising:
   a plurality of signal connection terminals;
   a circumferential side wall, comprising:
      a top surface, comprising:
         a plurality of fixing protrusions arranged at intervals on and around the top surface;
         at least one rib on and around the top surface; and
   a metal cover plate comprising:
      a bottom surface, comprising;
         a plurality of fixing holes on and around the bottom surface; wherein,
      when the metal case and the metal cover plate are assembled together, the plurality of fixing protrusions each respectively pass through the corresponding fixing holes and fix with each other; wherein,
      each one of the at least one rib is in direct contact with the bottom surface of the metal cover plate.

2. The signal leakage proof housing as claimed in claim 1, wherein the at least one rib is a single rib and is disposed between one side of the plurality of fixing protrusions and a corresponding edge of the top surface, and the rib does not overlap with any fixing protrusion.

3. The signal leakage proof housing as claimed in claim 1, wherein the at least one rib is a single rib and is overlapped with the plurality of fixing protrusions.

4. The signal leakage proof housing as claimed in claim 1, wherein the at least one rib includes a plurality of ribs, a part of the plurality of ribs are overlapped with the plurality of fixing protrusions, and the other ribs are disposed between either side of the plurality of fixing protrusions and the corresponding edge of the top surface and are not overlapped with the plurality of protrusions.

5. The signal leakage proof housing as claimed in claim 1, wherein the at least one rib includes a plurality of ribs which are disposed between either side of the fixing protrusion and the corresponding edge of the top surface, and the ribs do not overlap with any fixing protrusion.

6. The signal leakage proof housing as claimed in claim 1, wherein the at least one rib includes a plurality of ribs and the ribs are overlapped with the plurality of fixing protrusions.

7. The signal leakage proof housing as claimed in claim 1, wherein the bottom surface of the metal cover plate further comprises: at least one groove; wherein, when the metal case and the metal cover plate are assembled together, each of the at least one rib respectively and at least partially embedded in a corresponding groove.

8. The signal leakage proof housing as claimed in claim 7, wherein each of the at least one groove is formed by indentations on the bottom surface of the metal cover plate as a result of pressing the at least one rib onto the bottom surface of the metal cover plate when the metal case and the metal cover plate are assembled together.

* * * * *